United States Patent [19]

Gehrke et al.

[11] Patent Number: 5,498,998
[45] Date of Patent: Mar. 12, 1996

[54] METHOD FOR ADJUSTING THE OUTPUT FREQUENCY OF A FREQUENCY SYNTHESIZER

[76] Inventors: James K. Gehrke, 17 Hilltop Dr., Lake in the Hills, Ill. 60102; Robert J. Sarocka, 736 Hammerschmit, Lombard, Ill. 60148

[21] Appl. No.: 976,768

[22] Filed: Nov. 16, 1992

[51] Int. Cl.$^6$ ............................ H04B 1/40; H03L 7/00
[52] U.S. Cl. ............... 331/17; 331/1 A; 331/14; 331/25; 375/376; 327/141; 327/156; 455/260; 455/266
[58] Field of Search ............... 331/1 A, 8, 16, 331/17, 25, DIG. 2, 14; 375/376, 373; 455/260, 266; 327/141, 156

[56] References Cited

U.S. PATENT DOCUMENTS

| | | | |
|---|---|---|---|
| 4,506,233 | 3/1985 | Englund, Jr. | 331/17 |
| 4,587,496 | 5/1986 | Wolaver | 331/1 A |
| 4,771,249 | 5/1987 | Burch et al. | 331/17 |
| 4,901,033 | 2/1990 | Herold et al. | 331/1 A |
| 4,980,653 | 12/1990 | Shepherd | 331/16 |
| 5,146,187 | 9/1992 | Vandegraaf | 331/17 |
| 5,151,665 | 9/1992 | Wentzler | 331/8 |
| 5,315,623 | 5/1994 | Kuo | 375/376 |
| 5,400,372 | 3/1995 | Watanabe et al. | 375/376 |
| 5,406,591 | 4/1995 | Watanabe | 375/376 |
| 5,448,763 | 9/1995 | Gillig | 455/266 X |

Primary Examiner—Benny Lee
Assistant Examiner—Arnold Kinkead
Attorney, Agent, or Firm—Susan L. Lukasik; Nedra D. Karim

[57] ABSTRACT

Adjustment of the output frequency of a frequency synthesizer can be optimized in the following manner. Once a frequency adjustment request is detected, which indicates a selected frequency, a frequency difference is calculated between the selected frequency and the present frequency. A frequency scaling factor is then determined. Once the frequency difference and the frequency scaling factor are determined, a frequency adjustment time is calculated based on a proportional relationship between the frequency difference and the frequency scaling factor. The bandwidth of a multi-bandwidth filter is adjusted to a second bandwidth for the duration of the calculated frequency adjustment time. The output frequency of the frequency synthesizer is adjusted from the present frequency to the selected frequency prior to the expiration of the frequency adjustment time. Upon expiration of the frequency adjustment time, the bandwidth of the multi-bandwidth filter is adjusted from the second bandwidth to the first bandwidth.

7 Claims, 2 Drawing Sheets

METHOD FOR ADJUSTING THE OUTPUT FREQUENCY OF A FREQUENCY SYNTHESIZER

FIELD OF THE INVENTION

This invention relates generally to frequency synthesizers and, in particular, to adjustable output frequency synthesizers.

BACKGROUND OF THE INVENTION

Frequency synthesizers are known to comprise a reference oscillator, a reference divider, a phase detector, an output frequency divider, a voltage control oscillator, and a multi-bandwidth filter. Typically, a frequency synthesizer provides a stable frequency output, or local oscillator, for communication equipment. The communication equipment, which may be a television, an AM radio, an FM radio, a portable communication radio, or a cellular telephone, includes a selection device such that the output frequency of the frequency synthesizer can be changed. By changing the output frequency, the communication equipment can receive a new channel. For example, when an AM radio changes its channel from 720 to 780, the output frequency of the frequency synthesizer within the radio changes from 720 kHz to 780 kHz.

As is also known, the multi-bandwidth filter, which is a low pass filter, attenuates high frequency signals and noise while allowing low frequency signals to pass. To adequately attenuate high frequency signals, the filter includes a relatively large capacitance which impedes rapid changes in output frequencies. To expedite an output frequency change, the filter is changed from a narrow bandwidth to a wide bandwidth for a fixed period of time. The change fin the bandwidth provides a lower impedance path such that the capacitance within the filter is charged, or discharged, at a faster rate. Ideally, the wide bandwidth would be as wide as possible to keep the frequency synthesizer stable, however, the bandwidth is typically a factor of 10 times the narrow bandwidth.

When the multi-bandwidth filter returns to its previous narrow bandwidth, there is a tendency of the multi-bandwidth filter to return to the previous control voltage. This phenomenon is called dielectric absorption. This causes a frequency pull-back condition to occur wherein the output frequency of the frequency synthesizer, although adjusted for the selected frequency, tends to return towards the previous frequency until the multi-bandwidth filter stabilizes, thereby increasing the frequency adjustment response time. The amplitude of the pull-back decays proportionally to the amount of time the filter is in the wide band, and increases with the amount of frequency change.

Since the duration of the frequency adjustment time is fixed, it is determined based on acceptable pull-back for the greatest expected frequency change. For example, the greatest frequency change in an AM radio is from 520 kHz to 1600 kHz. For small frequency changes, such as from 720 kHz to 780 kHz, the fixed frequency adjustment time is greater than what is needed to achieve the frequency change thereby instilling an unnecessary delay in the transition time.

Therefore, a need exists for a method of adjusting the output frequency of a frequency synthesizer that optimizes the transition time and response.

DESCRIPTION OF A PREFERRED EMBODIMENT

Generally, this invention provides a method for improving the transition time and response of a frequency synthesizer when its output frequency is changed. This is achieved by basing the frequency adjustment time of the bandwidth filter on the frequency change. Once a frequency change has been sensed, an optimum frequency adjustment time for the frequency change can be calculated. The bandwidth of the filter is then adjusted for the duration of the frequency adjustment time. The output frequency is then adjusted some time before the expiration of the frequency adjustment time. After the frequency adjustment time has expired, the multi-bandwidth filter is readjusted to its previous bandwidth. This leads to better response time per frequency change.

Figure 1:
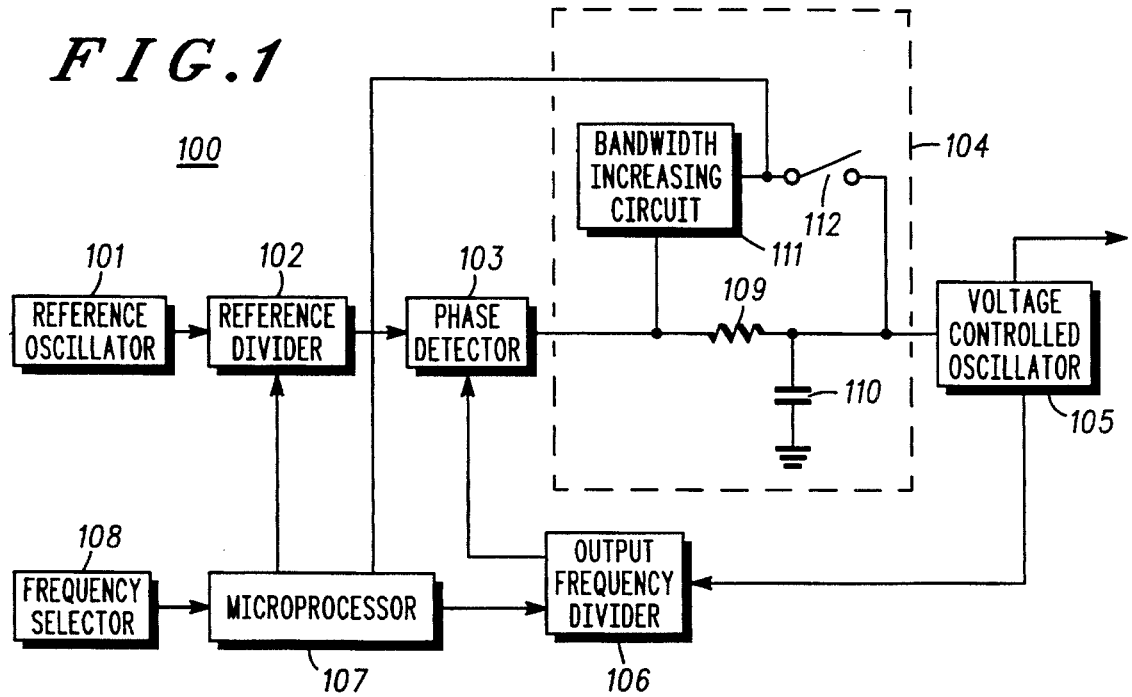
FIG. 1 illustrates a frequency synthesizer in accordance with the present invention.

The present invention can be more fully described with reference to FIGS. 1–5. FIG. 1 illustrates a frequency synthesizer 100 that includes a reference oscillator 101, a reference divider 102, a phase detector 103, a multi-bandwidth filter 104, a voltage controlled oscillator 105, an output frequency divider 106, a microprocessor 107, and a frequency selector 108. The multi-bandwidth filter comprises a resistor 109, a capacitor 110, a bandwidth increasing circuit element 111, and a switch 112. The reference divider 102, the phase detector 103, and the output frequency divider 106 may comprise a Motorola, Inc. MC145170 phase detector integrated circuit. The bandwidth increasing circuit element 111 may comprise a resistor, a resistor network, a varying impedance element, or combination thereof. The remaining elements and their functions are known, thus no further description will be presented except to facilitate the understanding of the present invention.

Figure 2:
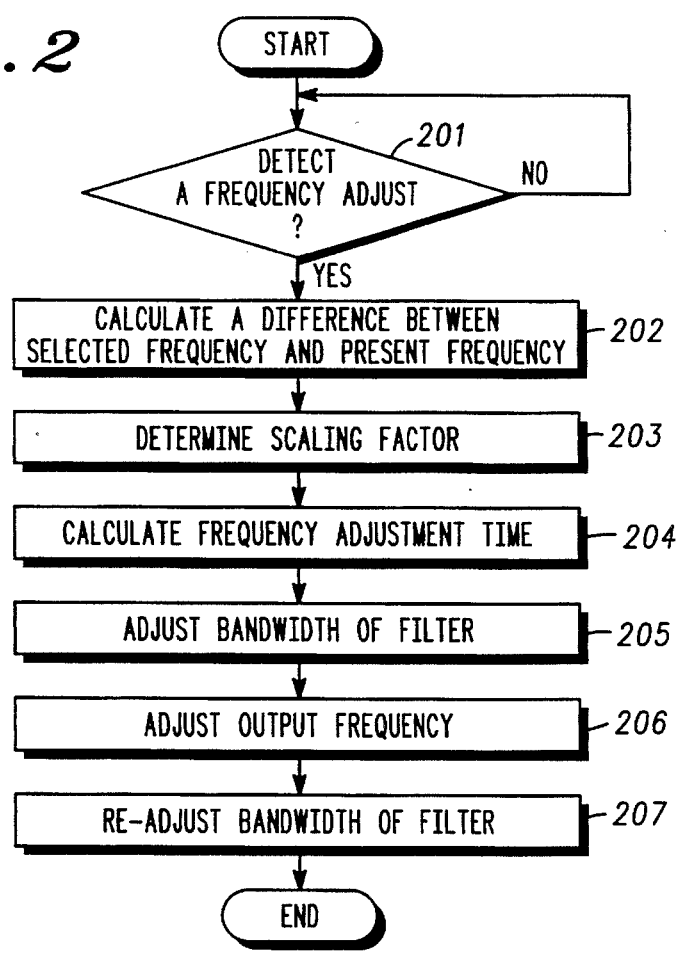
FIG. 2 illustrates a flow diagram which a microprocessor can employ to execute the present invention.

FIG. 2 illustrates a flow diagram which the microprocessor can employ to execute the present invention. The process begins at step 201 wherein, a frequency adjustment request is detected. When a frequency adjustment is detected, the difference between the present frequency and the selected frequency is calculated 202. The present frequency is the output frequency of the frequency synthesizer prior to the frequency adjustment request. The selected frequency is the desired output frequency selected via the frequency selector which may be a channel changer. The calculated difference could be equal to the absolute value of the present frequency minus the selected frequency. For example, if the present frequency of the voltage controlled oscillator is 150 MHz and the selected frequency is 160 MHz, the calculated difference would be 10 MHz.

Once the frequency difference is calculated, a frequency scaling factor is determined 203. The frequency scaling factor could be linear or non-linear. The frequency scaling factor may be based on the operating limits of the frequency synthesizer or based on the present and selected frequencies. To determine the frequency scaling factor based on the present and selected frequencies, the difference calculated in step 202 is further divided by the average of the present and selected,frequencies. For example if the present frequency is 150 MHz and the selected frequency is 160 MHz, the scaling factor would be 10 MHz divided by 155 MHz (the average of 150 MHz and 160 MHz) or 0.0645. To determine the frequency scaling factor based on the operating limits of the frequency synthesizer, the difference calculated in step 202 is further divided by the average of the lower and higher operating limits of the frequency synthesizer. For example, if the operating limits of the frequency synthesizer are 150 MHz to 170 Mhz, the present frequency is 150 MHz, and the selected frequency is 160 MHz, the scaling factor would be 10 MHz divided by 160 MHz (the average of 150 MHz and 170 MHz) or 0.0625.

After determining the frequency scaling factor, the frequency adjustment time is calculated based on a proportional relationship of the frequency scaling factor 204. Basically this is the time required to charge or discharge the capacitor 110. The frequency adjustment time may be equal to the frequency scaling factor multiplied by a constant plus a fixed time delay. A typical optimum frequency adjustment time for a 10 MHz frequency difference is 10 milliseconds and for very small frequency differences, the optimum frequency adjustment time is 1 millisecond based on standard component choices. Solving for x in the equation $y=mx+b$, where $y=$ frequency adjustment time, $m=$ frequency scaling factor, $x=$ a constant, and $b=1$ millisecond, the constant $x=(y-b)/m$. For $y=10$ milliseconds, $b=1$ millisecond, and $m=0.0645$, $x=0.140$ milliseconds.

Once the frequency adjustment time has been calculated, the bandwidth of the multi-bandwidth filter is adjusted from a first bandwidth to a second bandwidth for the duration of the frequency adjustment time 205. The first bandwidth is a narrow bandwidth which basically filters out spurs. The second bandwidth is wide to allow faster frequency changes. The second bandwidth may be fixed or based on the selected frequency. The time varying characteristic impedance of the circuit is dependent upon the difference between the present frequency and the selected frequency. By knowing this difference, the bandwidth of the filter can be maximized. Moving the multi-bandwidth filter from a narrow to a wide bandwidth could be accomplished by paralleling the bandwidth increasing element 111 with the resistor 109 in the filter, by increasing the current source, or a combination thereof. For example, the microprocessor, as is known, senses the output frequency adjustment request and generates a signal which causes the switch 112 to close for the duration of the frequency adjustment time.

After the frequency adjustment time has been calculated, the output frequency of the frequency synthesizer is adjusted from the present frequency to the selected frequency prior to the expiration of the frequency adjustment time 206. This may occur simultaneously with step 205 but is not a requirement as long as the output frequency is changed prior to the expiration of the frequency adjustment time. After the frequency adjustment time expires, the bandwidth of the multi-bandwidth filter is adjusted from the second bandwidth to the first bandwidth 207.

Figure 3:
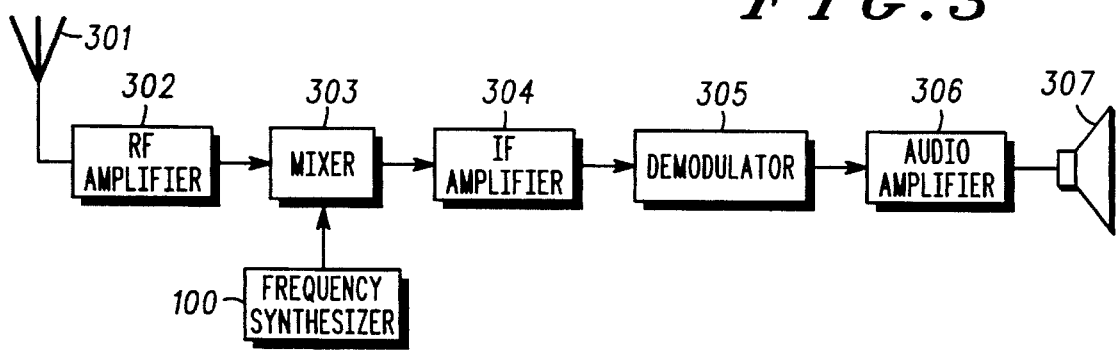
FIG. 3 illustrates a receiver that incorporates the present invention.

FIG. 3 illustrates a receiver that incorporates the present invention 100 and further includes an antenna 301, a radio frequency (RF) amplifier 302, a mixer 303, an intermediate frequency (IF) amplifier 304, a demodulator 305, an audio amplifier 306 and a speaker 307. These elements are known thus no further description will be presented. The receiver may be for an AM radio, an FM radio, a UHF, VHF television, a cellular radio, a trunked radio, etc.

Figure 4:
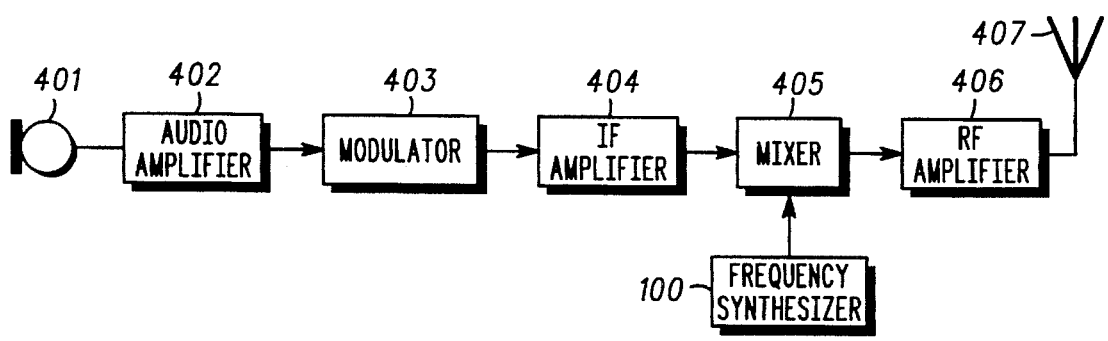
FIG. 4 illustrates a transmitter that incorporates the present invention.

FIG. 4 illustrates a radio frequency (RF) transmitter that incorporates the present invention and further includes a microphone 401, an amplifier 402, a modulator 403, an intermediate frequency (IF) amplifier 404, a mixer 405, a radio frequency (RF) amplifier 406, and an antenna 407. These elements are known thus no further description will be presented. The transmitter may be for a cellular radio, a trunked radio, a base station, etc.

Figure 5:
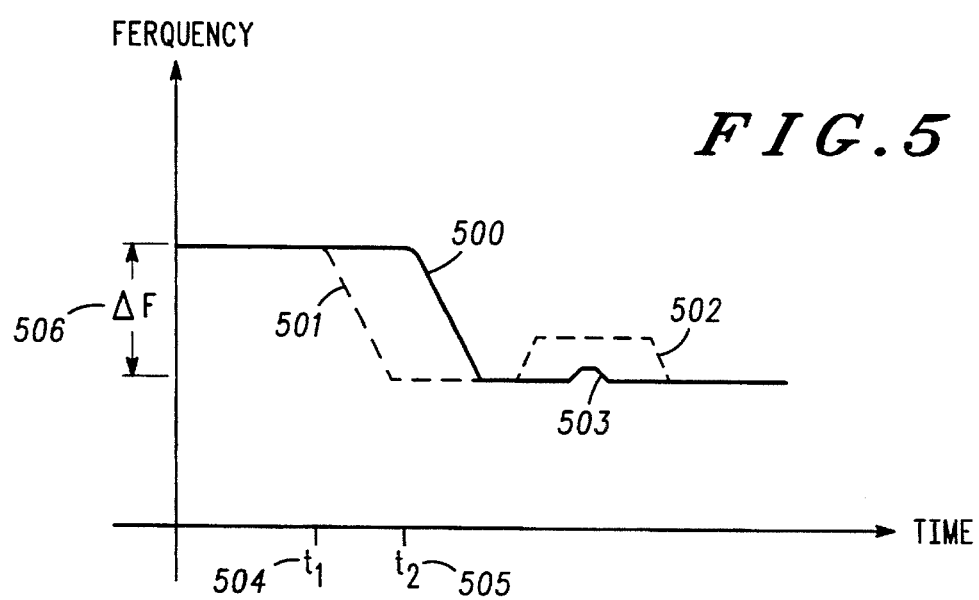
FIG. 5 illustrates a change in the output frequency of the present invention in comparison with the prior art.

FIG. 5 illustrates a change in the output frequency of the present invention 500 in comparison with the prior art 501. From the figure, 500 is the response time of the present invention, 501 is the response time of the prior art, 502 is the frequency pull-back of the prior art, 503 is the frequency pull-back of the present invention, 504 is the fixed frequency adjustment time of the prior art, and 505 is the variable frequency adjustment time of the present invention. For example, if the present frequency of the frequency synthesizer is 150 MHz, the selected frequency is 160 MHz, the operating limits of the frequency synthesizer is 150 MHz to 170 MHz, and the scaling factor is 0.0645, the frequency adjustment time of the present invention, $y=mx+b$, where $y=$ frequency adjustment time, $m=$ frequency scaling factor, $x=0.140$ ms, and $b=1$ ms, would be $(0.0645 * 0.140\ ms)+1\ ms=10.03$ ms. For the prior art, the frequency adjustment time would be fixed at, for example, 15 milliseconds no matter what the frequency adjustment is.

The above describes a method for optimizing the transition time and response of a frequency synthesizer. By varying the time in which the bandwidth of the filter is changed based on a frequency difference, the response and transition time are improved over a prior art frequency synthesizer.

We claim:

1. In a frequency synthesizer that includes a reference oscillator, a reference divider, a phase detector, an output frequency divider, a voltage control oscillator, and a multi-bandwidth filter, a method for adjusting output frequency of the frequency synthesizer, the method comprises the steps of:

a) detecting a frequency adjustment request, wherein the frequency adjustment request indicates a selected frequency;

b) calculating a difference between the selected frequency and a present frequency to produce a frequency difference;

c) determining a frequency scaling factor;

d) calculating a frequency adjustment time based on a proportional relationship between the frequency difference and the frequency scaling factor, wherein the proportional relationship is based on time required to charge or discharge a capacitor of the multi-bandwidth filter to produce an optimum pull-back for the frequency difference;

e) adjusting bandwidth of the multi-bandwidth filter from a first bandwidth to at least a second bandwidth for a duration of the frequency adjustment time;

f) adjusting the output frequency of the frequency synthesizer from the present frequency to the selected frequency prior to expiration of the frequency adjustment time; and g) upon expiration of the frequency adjustment time, adjusting the bandwidth of the multi-bandwidth filter from the second bandwidth to the first bandwidth.

2. The method of claim 1, wherein step (c) further comprises determining the frequency scaling factor based on an average of the selected frequency and the present frequency.

3. The method of claim 1, wherein step (c) further comprises determining the frequency scaling factor based on frequency operating limits of the frequency synthesizer.

4. The method of claim 1, wherein step (e) further comprises determining the second bandwidth based on the selected frequency.

5. In a communication device that includes a radio frequency (RF) receiver and a frequency synthesizer that provides a local oscillator frequency, wherein the frequency synthesizer includes a reference oscillator, a reference divider, a phase detector, an output frequency divider, a voltage control oscillator, and a multi-bandwidth filter, a method for adjusting the local oscillator frequency, the method comprising the steps of:

a) detecting a channel adjustment request, wherein the channel adjustment request indicates a selected frequency;

b) calculating a difference between the selected frequency and a present frequency to produce a frequency difference;

c) determining a frequency scaling factor;

d) calculating a frequency adjustment time based on a proportional relationship between the frequency difference and the frequency scaling factor, wherein the proportional relationship is based on time required to charge or discharge a capacitor of the multi-bandwidth filter to produce an optimum pull-back for the frequency difference;

e) adjusting bandwidth of the multi-bandwidth filter from a first bandwidth to at least a second bandwidth for a duration of the frequency adjustment time;

f) adjusting the local oscillator frequency from the present frequency to the selected frequency prior to expiration of the frequency adjustment time; and g) upon expiration of the frequency adjustment time, adjusting the bandwidth of the multi-bandwidth filter from the second bandwidth to the first bandwidth.

6. In a communication device that includes a radio frequency (RF) transmitter and a frequency synthesizer that provides a frequency reference, wherein the frequency synthesizer includes a reference oscillator, a reference divider, a phase detector, an output frequency divider, a voltage control oscillator, and a multi-bandwidth filter, a method for adjusting the frequency reference, the method comprising the steps of:

a) detecting a channel adjustment request, wherein the channel adjustment request indicates a selected frequency;

b) calculating a difference between the selected frequency and a present frequency to produce a frequency difference;

c) determining a frequency scaling factor;

d) calculating a frequency adjustment time based on a proportional relationship between the frequency difference and the frequency scaling factor, wherein the proportional relationship is based on time required to charge or discharge a capacitor of the multi-bandwidth filter to produce an optimum pull-back for the frequency difference;

e) adjusting bandwidth of the multi-bandwidth filter from a first bandwidth to at least a second bandwidth for a duration of the frequency adjustment time;

f) adjusting the frequency reference from the present frequency to the selected frequency prior to expiration of the frequency adjustment time; and g) upon expiration of the frequency adjustment time, adjusting the bandwidth of the multi-bandwidth filter from the second bandwidth to the first bandwidth.

7. In a frequency synthesizer that includes a reference oscillator, a reference divider, a phase detector, an output frequency divider, a voltage control oscillator, and a multi-bandwidth filter, a method for adjusting output frequency of the frequency synthesizer, the method comprising the steps of:

a) detecting a frequency adjustment request, wherein the frequency adjustment request indicates a selected frequency;

b) calculating a difference between the selected frequency and a present frequency to produce a frequency difference;

c) determining a frequency scaling factor;

d) calculating a frequency adjustment time based on the frequency difference and the frequency scaling factor, wherein the proportional relationship is based on time required to charge or discharge a capacitor of the multi-bandwidth filter to produce an optimum pull-back for the frequency difference;

e) adjusting bandwidth of the multi-bandwidth filter from a first bandwidth to at least a second bandwidth for a duration of the frequency adjustment time;

f) adjusting the output frequency of the frequency synthesizer from the present frequency to the selected frequency prior to expiration of the frequency adjustment time; and g) upon expiration of the frequency adjustment time, adjusting the bandwidth of the multi-bandwidth filter from the second bandwidth to the first bandwidth.

\* \* \* \* \*